United States Patent
Myong

(10) Patent No.: US 9,040,812 B2
(45) Date of Patent: May 26, 2015

(54) PHOTOVOLTAIC DEVICE INCLUDING FLEXIBLE SUBSTRATE OR INFLEXIBLE SUBSTRATE AND METHOD FOR MANUFACTURING THE SAME

(71) Applicant: Intellectual Discovery Co., Ltd., Seoul (KR)

(72) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 0 days.

(21) Appl. No.: 13/974,681

(22) Filed: Aug. 23, 2013

(65) Prior Publication Data

US 2013/0340818 A1   Dec. 26, 2013

Related U.S. Application Data

(62) Division of application No. 13/071,074, filed on Mar. 24, 2011.

(30) Foreign Application Priority Data

Mar. 26, 2010   (KR) ................ 10-2010-0027280

(51) Int. Cl.
*H01L 31/0352*   (2006.01)
*H01L 31/0236*   (2006.01)
(Continued)

(52) U.S. Cl.
CPC .... *H01L 31/03529* (2013.01); *H01L 31/02363* (2013.01); *H01L 31/03685* (2013.01);
(Continued)

(58) Field of Classification Search
CPC ................ H01L 31/02363; H01L 31/03685; H01L 31/03687; H01L 31/076; H01L 31/03529; H01L 31/03845; H01L 31/03926

USPC ............... 136/255, 256, 261, 252; 438/93, 96
See application file for complete search history.

(56) References Cited

U.S. PATENT DOCUMENTS 4,689,438 A   8/1987   Fukatsu et al.
5,370,747 A   12/1994  Noguchi et al.
(Continued)

FOREIGN PATENT DOCUMENTS

CN   1555341   12/2004
CN   101593779  12/2009
(Continued)

OTHER PUBLICATIONS

Yoshimi et al., JP 10-294481 A Online Machine Translation as provided by the Industrial Property Digital Library (IPDL) http://www19.ipdl.inpit.go.jp/PA1/cgi-bin/PA1 Index), Translated on Dec. 5, 2013.*

(Continued)

*Primary Examiner* — Golam Mowla
(74) *Attorney, Agent, or Firm* — H.C. Park & Associates, PLC

(57) ABSTRACT

A photovoltaic device including a substrate; a first electrode placed on the substrate; a second electrode which is placed opposite to the first electrode and which light is incident on; a first unit cell being placed between the first electrode and the second electrode, and including an intrinsic semiconductor layer including crystalline silicon grains making the surface of the intrinsic semiconductor layer toward the second electrode textured; and a second unit cell placed between the first unit cell and the second electrode.

7 Claims, 4 Drawing Sheets

(51) Int. Cl.
  *H01L 31/0368* (2006.01)
  *H01L 31/076* (2012.01)
  *H01L 31/0384* (2006.01)
  *H01L 31/0392* (2006.01)

(52) U.S. Cl.
  CPC ........ *H01L31/03687* (2013.01); *H01L 31/076* (2013.01); *Y02E 10/545* (2013.01); *Y02E 10/548* (2013.01); *H01L 31/03845* (2013.01); *H01L 31/03926* (2013.01)

(56) References Cited

U.S. PATENT DOCUMENTS

| | | | |
|---|---|---|---|
| 5,500,055 | A | 3/1996 | Toyama et al. |
| 5,549,763 | A | 8/1996 | Sano et al. |
| 5,668,050 | A | 9/1997 | Iwasaki |
| 5,981,867 | A | 11/1999 | Toyama et al. |
| 5,986,204 | A | 11/1999 | Iwasaki et al. |
| 6,566,595 | B2 | 5/2003 | Suzuki |
| 2002/0050289 | A1 | 5/2002 | Wada et al. |
| 2004/0231590 | A1 | 11/2004 | Ovshinsky |
| 2006/0086385 | A1* | 4/2006 | Nakano et al. ............. 136/255 |
| 2007/0151596 | A1 | 7/2007 | Nasuno et al. |
| 2007/0199591 | A1 | 8/2007 | Harder et al. |
| 2008/0173348 | A1 | 7/2008 | Nasuno et al. |
| 2008/0173350 | A1* | 7/2008 | Choi et al. ............. 136/258 |
| 2009/0229664 | A1 | 9/2009 | Appadurai |
| 2010/0089449 | A1 | 4/2010 | Ahn et al. |

FOREIGN PATENT DOCUMENTS

| | | | |
|---|---|---|---|
| JP | 10-294481 A | * 11/1998 | ............ H01L 31/04 |
| JP | 1998-294481 | 11/1998 | |
| JP | 3745076 | 2/2006 | |
| WO | 2009/142156 | 11/2009 | |

OTHER PUBLICATIONS

Non-Final Office Action issued on Jan. 30, 2013 in U.S. Appl. No. 13/071,074.
Notice of Allowance dated Aug. 26, 2013 in U.S. Appl. No. 13/071,074.
Non-Final Office Action issued on Dec. 16, 2013 in U.S. Appl. No. 13/071,074.
Non-Final Office Action dated Mar. 25, 2014 in U.S. Appl. No. 13/071,074.
Non-Final Office Action dated Jun. 19, 2014 in U.S. Appl. No. 13/071,074.
Notice of Allowance issued Oct. 2, 2014, in U.S. Appl. No. 13/071,074.
Notice of Allowance issued Mar. 6, 2015, in U.S. Appl. No. 13/071,074.

* cited by examiner

PHOTOVOLTAIC DEVICE INCLUDING FLEXIBLE SUBSTRATE OR INFLEXIBLE SUBSTRATE AND METHOD FOR MANUFACTURING THE SAME

CROSS-REFERENCE TO RELATED APPLICATIONS

This application is a divisional of U.S. patent application Ser. No. 13/071,074, filed on Mar. 24, 2011 and claims the benefit of and priority from Korean Patent Application No. 10-2010-0027280 filed on Mar. 26, 2010, which are both hereby incorporated by reference for all purpose as if fully set forth herein.

BACKGROUND

1. Field

The present invention relates to a photovoltaic device including a flexible substrate or an inflexible substrate and a method for manufacturing the same.

2. Discussion of the Background

Recently, because of a high oil price and a global warming phenomenon based on a large amount $CO_2$ emission, energy is becoming the most important issue in determining the future life of mankind. Even though many renewable energy technologies including wind force, bio-fuels, a hydrogen/fuel cell and the like have been developed, a photovoltaic device using sunlight is in the spotlight in that solar energy, the origin of all energies, is an almost infinite clean energy source.

The sunlight incident on the surface of the earth has an electric power of 120,000 TW. Thus, theoretically, if a photovoltaic device having a photoelectric conversion efficiency of 10% covers only 0.16% of the land surface of the earth, it is possible to generate electric power of 20 TW that is twice as much as the amount of energy globally consumed during one year.

Actually, the world photovoltaic market has explosively grown by almost 40% of an annual growth rate for the last ten years. Now, a bulk-type silicon photovoltaic device occupies a 90% of the photovoltaic device market share. The bulk-type silicon photovoltaic device includes a single-crystalline silicon photovoltaic device and a multi-crystalline or a poly-crystalline silicon photovoltaic device and the like. However, productivity of a solar-grade silicon wafer which is the main material of the photovoltaic device is not able to fill the explosive demand thereof, so the solar-grade silicon wafer is globally in short supply. Therefore, this shortage of the solar-grade silicon wafer is a huge threatening factor in reducing the manufacturing cost of a photovoltaic device.

Contrary to this, a thin-film silicon photovoltaic device based on a hydrogenated amorphous silicon (a-Si:H) allows to reduce a thickness of a silicon layer equal to or less than $\frac{1}{100}$ as large as that of a silicon wafer of the bulk-type silicon photovoltaic device. Also, it makes possible to manufacture a large area photovoltaic device at a lower cost.

Meanwhile, a single-junction thin-film silicon photovoltaic device is limited in its achievable performance. Accordingly, a double junction thin-film silicon photovoltaic device or triple junction thin-film silicon photovoltaic device having a plurality of stacked unit cells has been developed, pursuing high stabilized efficiency.

The double junction or triple junction thin-film silicon photovoltaic device is referred to as a tandem-type photovoltaic device. The open circuit voltage of the tandem-type photovoltaic device corresponds to a sum of each unit cell's open circuit voltage. Short circuit current is determined by a minimum value among the short circuit currents of the unit cells.

Regarding the double junction thin-film silicon photovoltaic device or the triple junction thin-film silicon photovoltaic device, research is being devoted to an electrode surface texture in order to improve efficiency by means of light scattering.

SUMMARY

An exemplary embodiment of the present invention discloses a photovoltaic device including: a substrate; a first electrode disposed on the substrate; a second electrode disposed opposite to the first electrode and on which light is incident a first unit cell being disposed between the first electrode and the second electrode, and including an intrinsic semiconductor layer including crystalline silicon grains making the surface of the intrinsic semiconductor layer toward the second electrode textured; and a second unit cell placed between the first unit cell and the second electrode.

An exemplary embodiment of the present invention also discloses a method for manufacturing a photovoltaic device including: forming an n-type semiconductor layer of the first unit cell; forming an intrinsic semiconductor layer of the first unit cell on the n-type semiconductor layer, the intrinsic semiconductor layer including an amorphous silicon based material surrounding crystalline silicon grain; etching the surface of the intrinsic semiconductor layer; and forming a p-type semiconductor layer of the first unit cell on the intrinsic semiconductor layer.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Hereinafter, a photovoltaic device according to an exemplary embodiment of the present invention will be described in detail with reference to the accompanying drawings.

Figure 1A:
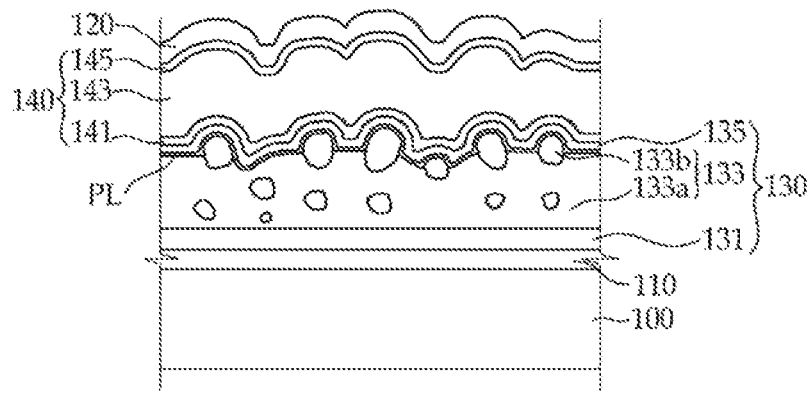
FIGS. 1*a* and 1*b* show a photovoltaic device according to an exemplary embodiment of the present invention.

FIG. 1 shows a photovoltaic device according to an exemplary embodiment of the present invention. As shown in FIG. 1, the photovoltaic device according to an exemplary embodiment of the present invention includes a substrate 100, a first electrode 110, a second electrode 120, a first unit cell 130 and a second unit cell 140.

The substrate 100 is a flexible substrate or an inflexible substrate. The flexible substrate includes either a metal substrate made of stainless steel or aluminum foil, or a plastic substrate made of Polyethylene Naphthalate (PEN) or Poly Ethylene Terephthalate (PET). In the metal substrate, an insulating film is formed on the surface of the metal substrate in order to insulate the metal substrate from an electrode formed on the metal substrate. The inflexible substrate may include a glass substrate.

The first electrode 110 is placed on the substrate 100. In an n-i-p type photovoltaic device, since light is incident through the second unit cell 140, the first electrode 110 adjacent to the substrate 100 may or may not have light transmittance. Therefore, the first electrode 110 may be formed of a metallic material or be formed of a light-transmitting conductive material like transparent conductive oxide (TCO).

The second electrode 120 is placed opposite to the first electrode 110. Light is incident on the second electrode 120. As described above, in the n-i-p type photovoltaic device, since light is incident through the second unit cell 140, light is incident on the second electrode 120 prior to the first electrode 110. Therefore, the second electrode 120 may be formed of a light transmitting conductive material.

The first unit cell 130 is located between the first electrode 110 and the second electrode 120, and includes an intrinsic semiconductor layer 133 including crystalline silicon grains forming a textured surface toward the second electrode 120. The first unit cell 130 includes an n-type semiconductor layer 131, an intrinsic semiconductor layer 133 and a p-type semiconductor layer 135, which are sequentially stacked. Therefore, among the n-type semiconductor layer 131, the intrinsic semiconductor layer 133 and the p-type semiconductor layer 135, the n-type semiconductor layer 131 is the closest to the first electrode 110.

In an exemplary embodiment of the present invention, since light is incident on the first unit cell 130 posterior to the second unit cell 140, the first unit cell 130 absorbs more light of a long wavelength than light of a short wavelength. Therefore, in order to easily absorb the light of a long wavelength, the intrinsic semiconductor layer 133 of the first unit cell 130 includes a hydrogenated microcrystalline silicon based material layer. The hydrogenated microcrystalline silicon based material layer is composed of hydrogenated microcrystalline silicon (i-μc-Si:H) or hydrogenated microcrystalline silicon germanium (i-μc-SiGe:H).

The hydrogenated microcrystalline silicon based material layer includes a hydrogenated amorphous silicon based material 133a and crystalline silicon grains 133b surrounded by the hydrogenated amorphous silicon based material 133a. The crystalline silicon grains 133b projects toward the second electrode 120, so that the surface toward the second electrode 120 among the surfaces of the intrinsic semiconductor layer 133 is textured. A method for projecting the crystalline silicon grains 133b toward the second electrode 120 will be described later in detail.

As such, due to the textured surface formed by the crystalline silicon grains 133, the surfaces of an n-type semiconductor layer 141, an intrinsic semiconductor layer 143 and a p-type semiconductor layer 145 of the second unit cell 140 are also textured. Hereby, light incident on the second unit cell 140 may be scattered.

In the n-i-p type photovoltaic device, though the surface of either the substrate 100 or the first electrode 110 is textured, the surface of the second unit cell 140 on which light is incident is not textured enough since the thicknesses of the first unit cell 130 and the second unit cell 140 are large. That is, since the thicknesses of the first unit cell 130 and the second unit cell 140 are large, the surfaces of the first unit cell 130 and the second unit cell 140 can be flattened while the first unit cell 130 and the second unit cell 140 are formed by deposition.

On the contrary, in the photovoltaic device according to an exemplary embodiment of the present invention, the crystalline silicon grains of the first unit cell 130 project toward the second unit cell 140. Therefore, the surface of the second unit cell 140 is textured when the second unit cell 140 is formed on the first unit cell 130.

As described above, an average crystal volume fraction of the intrinsic semiconductor layer 133 including the hydrogenated microcrystalline silicon based material layer is equal to or more than 25% and equal to or less than 75%.

When the average crystal volume fraction of the intrinsic semiconductor layer 133 is equal to or more than 25%, an incubation layer including hydrogenated amorphous silicon can be prevented from being formed either between the intrinsic semiconductor layer 133 and the p-type semiconductor layer 135 or between the intrinsic semiconductor layer 133 and the n-type semiconductor layer 131. Accordingly, hole transition or electron transition is easily performed, so that electron-hole recombination is reduced and photoelectric conversion efficiency is improved.

When the average crystal volume fraction of the intrinsic semiconductor layer 133 is equal to or less than 75%, the size of the crystalline silicon grain is prevented from excessively increasing and the volume of grain boundary is hereby prevented from increasing.

The second unit cell 140 is located between the first unit cell 130 and the second electrode 120. The second unit cell 140 includes an n-type semiconductor layer 141, an intrinsic semiconductor layer 143 and a p-type semiconductor layer 145, which are sequentially stacked. Therefore, among the n-type semiconductor layer 141, the intrinsic semiconductor layer 143 and the p-type semiconductor layer 145, the p-type semiconductor layer 145 is the closest to the second electrode 120.

Here, the p-type semiconductor layer 135 of the first unit cell 130 and the p-type semiconductor layer 145 of the second unit cell 140 are doped with group III impurities. The n-type semiconductor layer 131 of the first unit cell 130 and the n-type semiconductor layer 141 of the second unit cell 140 are doped with group V impurities.

Figure 1B:
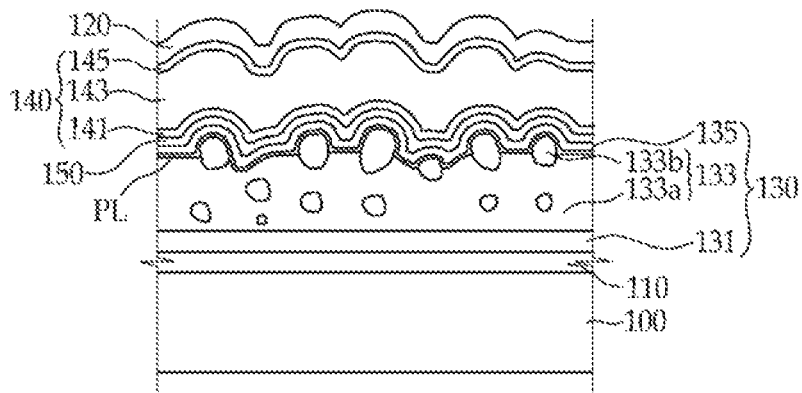

Meanwhile, as shown in FIG. 1b, the photovoltaic device according to an exemplary embodiment of the present invention further includes an intermediate reflector 150 located between the first unit cell 130 and the second unit cell 140. An average refractive index of the intermediate reflector 150 is equal to or more than 1.7 and is equal to or less than 2.5 at a wavelength of 600 nm. In such a state, refractive index matching occurs. As a result, light of a short wavelength is reflected to the second unit cell 140, so that the photoelectric conversion efficiency of the photovoltaic device is improved.

Next, a method for manufacturing the photovoltaic device according to an exemplary embodiment of the present invention will be described in detail with reference to the drawings.

Figure 2A:
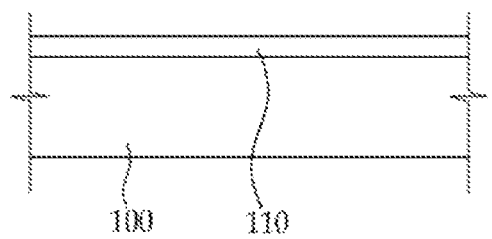
FIGS. 2*a* to 2*h* show a method for manufacturing the photovoltaic device according to an exemplary embodiment of the present invention.

As shown in FIG. 2a, provided is a substrate 100 on which the first electrode 110 is formed by a sputtering method. Before the first electrode 110 is formed, a cleaning process may be performed on the substrate 100. When the first electrode 110 is made of a metallic material, a ZnO layer may be formed between the first electrode 110 and the substrate 100 in order to increase an adhesive strength between the first electrode 110 and the substrate 100. Since the substrate 100 has been described above in detail, the description thereof will be omitted.

Figure 2B:
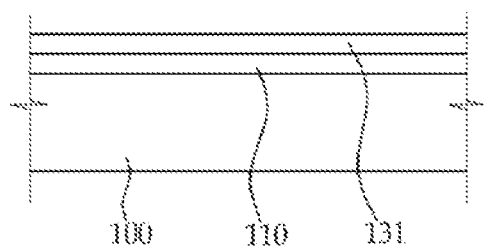

As shown in FIG. 2b, the n-type semiconductor layer 131 of the first unit cell 130 is formed on the first electrode 110.

Figure 2C:
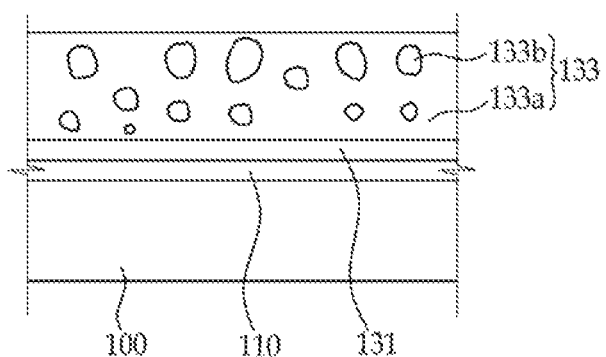

As shown in FIG. 2c, the intrinsic semiconductor layer 133 of the first unit cell 130 is formed on the n-type semiconductor layer 131. Here, the intrinsic semiconductor layer 133 of the first unit cell 130 includes the amorphous silicon based material 133a surrounding the crystalline silicon grains 133b. That is, the intrinsic semiconductor layer 133 of the first unit cell 130 can include a hydrogenated microcrystalline silicon based material layer having a mixed phase. As described above, the average crystal volume fraction of the intrinsic semiconductor layer 133 is equal to or more than 25% and is equal to or less than 75%.

Figure 2D:
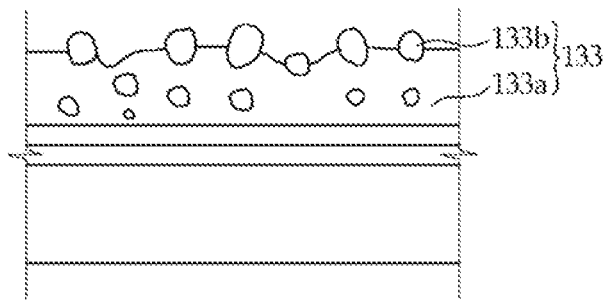

As shown in FIG. 2d, the surface of the intrinsic semiconductor layer 133 is etched. Here, the surface of the intrinsic semiconductor layer 133 is etched by using a dry-etching process such as a hydrogen plasma etching process or an argon plasma etching process. When the photovoltaic device according to an exemplary embodiment of the present invention includes a flexible substrate, a chemical etching process transforms or damages the flexible substrate composed of a metallic material or a polymer. However, the dry-etching process has less influence on the flexible substrate than the chemical etching process.

Accordingly, the intrinsic semiconductor layer 133 is selectively etched. In other words, as described above, the intrinsic semiconductor layer 133 includes the crystalline silicon grains and the amorphous silicon based material, which have different etch rates from each other. The amorphous silicon based material is etched more quickly than the crystalline silicon grain under the same condition. Therefore, through the dry-etching process, the crystalline silicon grains surrounded by the amorphous silicon based material are projected. The surface of the intrinsic semiconductor layer 133 is textured due to the crystalline silicon grains projected by the aforementioned method.

Further, hole transport within the intrinsic semiconductor layer 133 is enhanced by removing the amorphous silicon based material. Accordingly, an open circuit voltage of the photovoltaic device and the photoelectric conversion efficiency of the photovoltaic device can be improved.

Figure 2E:
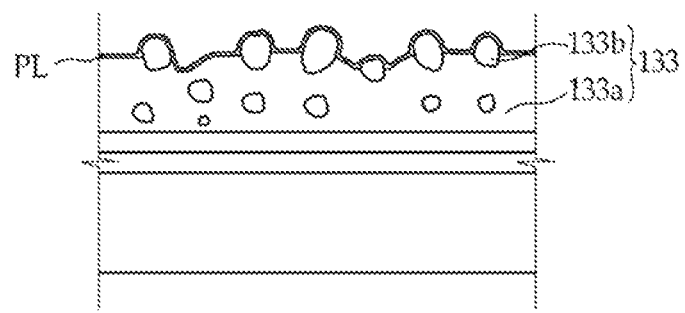

As shown in FIG. 2e, a passivation layer (PL) having a thickness of about 5 nm is formed on the etched intrinsic semiconductor layer 133. When the surface of the intrinsic semiconductor layer 133 is etched, electron-hole recombination can be increased on the surface of the intrinsic semiconductor layer 133. Therefore, the passivation layer (PL) is formed on the etched surface of the intrinsic semiconductor layer 133. Here, the passivation layer (PL) consists of the hydrogenated microcrystalline silicon based material. Since the intrinsic semiconductor layer 133 also includes the hydrogenated microcrystalline silicon based material, the manufacturing process thereof can be simplified.

Figure 2F:
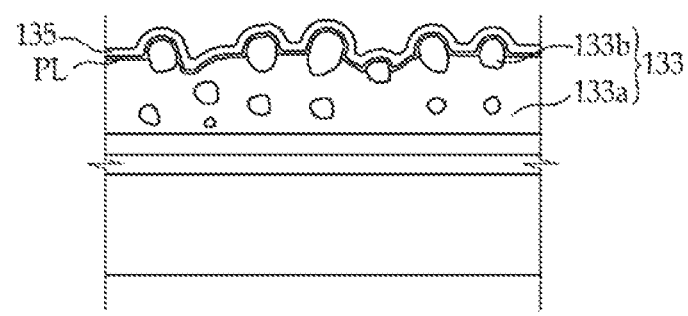

As shown in FIG. 2f, the p-type semiconductor layer 135 of the first unit cell 130 is formed on the intrinsic semiconductor layer 133. Here, the p-type semiconductor layer 135 is composed of hydrogenated microcrystalline silicon (p-µc-Si:H).

Figure 2G:
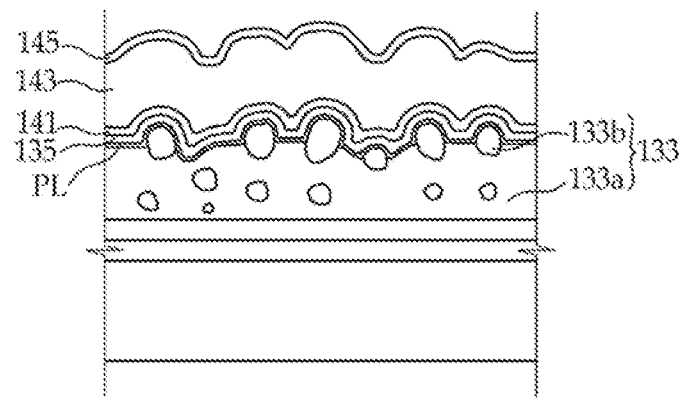

As shown in FIG. 2g, the n-type semiconductor layer 141, the intrinsic semiconductor layer 143 and the p-type semiconductor layer 145 are sequentially stacked on the first unit cell 130. Since the second unit cell 140 is formed on the first unit cell 130 having the textured surface, the surface of the second unit cell 140 is also textured. The intrinsic semiconductor layer 143 of the second unit cell 140 may be made of hydrogenated amorphous silicon (i-a-Si:H), hydrogenated amorphous silicon carbide (i-a-SiC:H), hydrogenated amorphous silicon oxide (i-a-SiO:H), hydrogenated proto-crystalline silicon (i-pc-Si:H) or hydrogenated proto-crystalline silicon having a multi-layer structure.

Figure 2H:
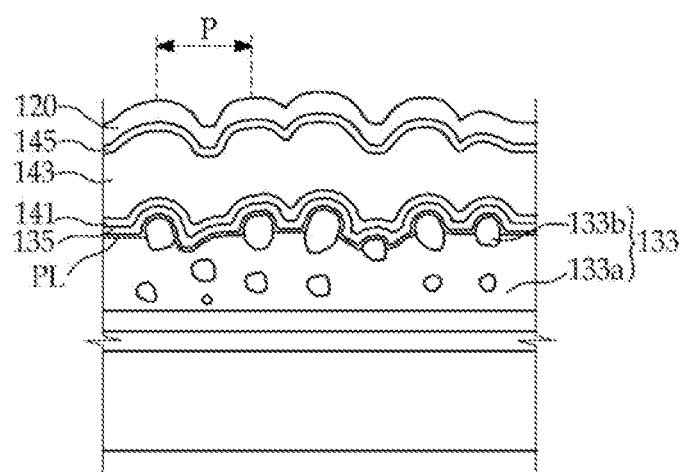

As shown in FIG. 2h, the second electrode 120 is formed on the second unit cell 140 by means of a sputtering method or an LPCVD method. Here, the second electrode 120 may be made of indium tin oxide (ITO), $SnO_2$:F or ZnO.

As such, the surface of the second electrode 120 is textured by the crystalline silicon grains 133b. The textured surface of the second electrode 120 has an average pitch equal to or more than 50 nm and equal to or less than 500 nm in order to scatter incident light. As shown in FIG. 2h, the average pitch corresponds to an average of distances "P" between two adjacent convex-up portions of the textured surface. The average pitch of the second electrode on which light is incident is equal to or more than 50 nm and equal to or less than 500 nm, the textured surface of the second electrode 120 is able to sufficiently scatter visible light.

Meanwhile, since the surface of the second electrode 120 is textured by the crystalline silicon grains 133b, it is not necessary to form the intermediate reflector 150 with a large thickness. For example, for the purpose that the surface of the second electrode 120 is textured by depositing the intermediate reflector 150 including ZnO, the surface of the intermediate reflector 150 should be fully textured. In order that the surface of the intermediate reflector 150 is textured as mentioned above, the thickness of the intermediate reflector 150 is required to be at least 1.6 µm. The processing time thereof is hereby increased.

Particularly, when the intermediate reflector 150 is formed in a roll-to-roll type manufacturing equipment, the substrate 100 is continuously moving, so that a time during which the substrate 100 stays in a process chamber is constant. Therefore when the thickness and processing time of the intermediate reflector 150 are increased, the number of the process chambers for forming the intermediate reflector 150 may increase.

Meanwhile, in the photovoltaic device according to an exemplary embodiment of the present invention, since the surface of the second electrode 120 is textured enough by the crystalline silicon grains 133b, the thickness of the intermediate reflector 150 can be prevented from being increased. The thickness of the intermediate reflector 150 according to an exemplary embodiment of the present invention is equal to or more than 20 nm and equal to or less than 200 nm. When the thickness of the intermediate reflector 150 is less than 20 nm, the refractive index matching is hard to obtain. When the thickness of the intermediate reflector 150 is larger than 200 nm, the amount of light absorbed by the intermediate reflector 150 is increased according to the increase of the thickness of the intermediate reflector 150. As a result, even though the photovoltaic device according to the exemplary embodiment of the present invention includes the flexible substrate 100, it is possible to prevent the processing time from being increased.

In an exemplary embodiment of the present invention, though the double-junction tandem photovoltaic device has been described, the present invention is applicable to an intermediate cell or a bottom cell of a triple-junction tandem photovoltaic device.

While an exemplary embodiment of the present invention has been described with reference to the accompanying drawings, it can be understood by those skilled in the art that the present invention can be embodied in other specific forms without departing from its spirit or essential characteristics. Therefore, the foregoing exemplary embodiments and advantages are merely exemplary and are not to be construed as limiting the present invention. The present teaching can be readily applied to other types of apparatuses. The description of the foregoing exemplary embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A photovoltaic device comprising:
a substrate;
a first electrode disposed on the substrate;
a second electrode disposed opposite to the first electrode and on which light is incident;
a first unit cell disposed between the first electrode and the second electrode, the first unit cell comprising an intrinsic semiconductor layer comprising a first surface that is textured by exposed crystalline silicon grains and that faces the second electrode, and a non-textured opposing second surface; and
a second unit cell disposed between the first unit cell and the second electrode,
wherein an average crystal volume fraction of the intrinsic semiconductor layer of the first unit cell is equal to or greater than 25% and equal to or less than 75%, and
wherein the intrinsic semiconductor layer comprises a mixed phase hydrogenated microcrystalline silicon based material comprising an amorphous silicon based material that partially covers the exposed crystalline silicon grains.

2. The photovoltaic device of claim 1, wherein the substrate comprises a flexible substrate.

3. The photovoltaic device of claim 1, wherein each of the first unit cell and the second unit cell comprises an n-type semiconductor layer, a p-type semiconductor layer, and an intrinsic semiconductor layer disposed between the n-type semiconductor layer and the P-type semiconductor layer.

4. The photovoltaic device of claim 1, wherein a surface of the p-type semiconductor layer of the second unit cell is textured.

5. The photovoltaic device of claim 1, wherein an average pitch of a textured surface of the second electrode is equal to or more than 50 nm and equal to or less than 500 nm.

6. The photovoltaic device of claim 1, further comprising an intermediate reflector located between the first unit cell and the second unit cell, and wherein a thickness of the intermediate reflector is equal to or more than 20 nm and equal to or less than 200 nm.

7. A photovoltaic device comprising:
a substrate;
a first electrode disposed on a first surface of the substrate;
a second electrode disposed opposite to the first electrode and on which light is incident; and
a first unit cell disposed between the first electrode and the second electrode, the first unit cell comprising an intrinsic semiconductor layer comprising a mixed phase hydrogenated microcrystalline silicon based material comprising an amorphous silicon based material and crystalline silicon grains, a first surface that is textured by the crystalline silicon grains exposed from a layer of amorphous silicon, and an opposing second surface,
wherein an average crystal volume fraction of the intrinsic semiconductor layer of the first unit cell is equal to or greater than 25% and equal to or less than 75%,
wherein the amorphous silicon based material at least partially covers the crystalline silicon grains, and
wherein the second surface of the intrinsic semiconductor layer and the first surface of the substrate are disposed in parallel planes.

* * * * *